(12) United States Patent
deVilliers

(10) Patent No.: US 10,811,265 B2
(45) Date of Patent: *Oct. 20, 2020

(54) LOCATION-SPECIFIC TUNING OF STRESS TO CONTROL BOW TO CONTROL OVERLAY IN SEMICONDUCTOR PROCESSING

(71) Applicant: Tokyo Electron Limited, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/661,655

(22) Filed: Oct. 23, 2019

(65) Prior Publication Data
US 2020/0058509 A1 Feb. 20, 2020

Related U.S. Application Data

(63) Continuation of application No. 15/695,961, filed on Sep. 5, 2017, now Pat. No. 10,475,657.
(Continued)

(51) Int. Cl.
*G03F 7/20* (2006.01)
*H01L 21/302* (2006.01)
(Continued)

(52) U.S. Cl.
CPC ........ *H01L 21/302* (2013.01); *G03F 7/70525* (2013.01); *G03F 7/70633* (2013.01);
(Continued)

(58) Field of Classification Search
CPC ............ G03F 7/70525; G03F 7/70633; G03F 7/70783; H01L 22/12; H01L 21/027; H01L 21/302; H01L 21/67253; H01L 21/67259; H01L 22/20; H01L 22/26; H01L 22/30; H01L 22/32
See application file for complete search history.

(56) References Cited

U.S. PATENT DOCUMENTS

| | | | |
|---|---|---|---|
| 5,851,929 | A | 12/1998 | Thakur |
| 5,972,570 | A | 10/1999 | Bruce |
| 6,916,585 | B2 | 7/2005 | Sreenivasan |
| 7,129,174 | B2 | 10/2006 | Kim |
| 7,184,853 | B2 | 2/2007 | Roberts |
| 7,645,546 | B2 | 1/2010 | Yang |

(Continued)

*Primary Examiner* — Deoram Persaud
(74) *Attorney, Agent, or Firm* — Oblon, McClelland, Maier & Neustadt, L.L.P.

(57) ABSTRACT

Techniques herein include systems and methods for correcting pattern overlay errors by correcting or adjusting bowing of wafers. Location-specific tuning of stress on semiconductor substrates reduces overlay error. Location-specific tuning of stress independently modifies specific regions, areas, or point locations on a substrate to change wafer bow at those specific locations, which reduces overlay error on substrates, which in turn improves overlay of subsequent patterns created on the substrate. Techniques herein include receiving a substrate with some amount of overlay error, measuring bow of the substrate to map z-height deviations across the substrate, generating an overlay correction pattern, and then physically modifying internal stresses on the substrate at specific locations with modifications independent of other coordinate locations. Such modifications can include etching a backside surface of the substrate. One or more processing modules can be used for such processing.

20 Claims, 8 Drawing Sheets

Related U.S. Application Data

(60) Provisional application No. 62/383,549, filed on Sep. 5, 2016.

(51) Int. Cl.

| | | |
|---|---|---|
| *H01L 21/027* | (2006.01) | |
| *H01L 21/67* | (2006.01) | |
| *H01L 21/687* | (2006.01) | |
| *G06F 30/20* | (2020.01) | |
| *G06F 30/23* | (2020.01) | |
| *H01L 21/66* | (2006.01) | |
| *G06T 7/00* | (2017.01) | |

(52) U.S. Cl.
CPC .......... *G03F 7/70783* (2013.01); *G06F 30/20* (2020.01); *G06F 30/23* (2020.01); *H01L 21/027* (2013.01); *H01L 21/0274* (2013.01); *H01L 21/6715* (2013.01); *H01L 21/67115* (2013.01); *H01L 21/67288* (2013.01); *H01L 21/6875* (2013.01); *H01L 22/12* (2013.01); *H01L 22/20* (2013.01); *H01L 22/30* (2013.01); *G06T 7/0004* (2013.01); *G06T 2207/30148* (2013.01)

(56) References Cited

U.S. PATENT DOCUMENTS

| | | |
|---|---|---|
| 7,868,467 B2 | 1/2011 | Lee |
| 9,430,593 B2 | 8/2016 | Vukkadala et al. |
| 10,025,894 B2 | 7/2018 | Vukkadala et al. |
| 2002/0045352 A1 | 4/2002 | Kubota |
| 2002/0132393 A1 | 9/2002 | Kraxenberger |
| 2005/0093101 A1 | 5/2005 | Matsumoto |
| 2005/0189616 A1 | 9/2005 | Brennan |
| 2006/0051938 A1 | 3/2006 | Connell |
| 2006/0273266 A1 | 12/2006 | Preil |
| 2007/0257336 A1 | 11/2007 | Matsumoto |
| 2008/0316504 A1 | 12/2008 | Nemets |
| 2009/0309191 A1 | 12/2009 | Theuss |
| 2011/0172982 A1 | 7/2011 | Veeraraghavan |
| 2012/0074523 A1 | 3/2012 | Goldstein |
| 2013/0089935 A1 | 4/2013 | Vukkadala |
| 2014/0045411 A1 | 2/2014 | Senderzon |
| 2014/0111779 A1 | 4/2014 | Chen |
| 2014/0209666 A1 | 7/2014 | Interrante |
| 2014/0379282 A1 | 12/2014 | Inaba |
| 2015/0044783 A1 | 2/2015 | Carswell |
| 2015/0294917 A1 | 10/2015 | deVilliers |
| 2015/0364362 A1 | 12/2015 | Engbrecht |
| 2015/0371909 A1 | 12/2015 | Bhagavat |
| 2018/0025899 A1 | 1/2018 | Kang |
| 2018/0067403 A1 | 3/2018 | deVilliers |
| 2018/0068860 A1 | 3/2018 | deVilliers |
| 2018/0145052 A1 | 5/2018 | Dasgupta |

LOCATION-SPECIFIC TUNING OF STRESS TO CONTROL BOW TO CONTROL OVERLAY IN SEMICONDUCTOR PROCESSING

CROSS REFERENCE TO RELATED APPLICATIONS

The present application is a continuation of U.S. Ser. No. 15/695,961, filed on Sep. 5, 2017, which claims the benefit of U.S. Provisional Patent Application No. 62/383,549, filed on Sep. 5, 2016, entitled "Method for Correcting Wafer Bow," which is incorporated herein by reference in its entirety.

BACKGROUND OF THE INVENTION

This disclosure relates to semiconductor fabrication, and particularly to wafer overlay.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

As semiconductor device fabrication technology advances, there are increasing demands on photolithography systems and coaters/developers used to manufacture the semiconductor devices. This includes increasing demands on the accuracy of substrate alignment. A substrate is typically mounted on a chuck, also referred to as a wafer table. During exposure, the features being exposed on the substrate need to overlay existing features on the substrate. In other words, Pattern B needs to be aligned with Pattern A. The alignment of subsequent layers is known as overlay. An error in overlay means that a layer is offset with respect to a layer below (or above) it. To achieve desired overlay performance, the substrate is aligned to the substrate stage prior to exposure. Any movement of the substrate relative to the substrate stage after alignment, however, can result in overlay errors. Conventional tools already exist to measure overlay error, such as by using scatterometers.

Various fabrication process steps (material deposition, etching, curing, et cetera) can cause expansion and/or contraction of the substrate, resulting in a warped or bowed substrate. For example, during exposure of actinic radiation, a substrate is heated locally due to the energy transferred to the substrate from an exposure beam. Substrates are also heated during anneal processes. This heating causes the substrate to expand. If the substrate expansion is unchecked, the expansion exceeds overlay error tolerances. Moreover, if the clamping force between the substrate and the substrate chuck is not sufficient to prevent substrate expansion, then the substrate can slip on the substrate chuck and larger substrate expansion will occur, resulting in larger overlay errors. Slipping can be more pronounced in some processes, such as in extreme ultraviolet ("EUV") systems, because the environment surrounding the substrate during exposure is a vacuum. Thus, vacuum clamping is not always possible, and the weaker electrostatic clamping must be used in lieu of a vacuum clamp.

Other fabrication steps can also cause substrate expansion and contraction. For example, deposited films can cause substrate contraction. Also, various annealing and doping steps can create substantial amounts of bow in a given substrate. Annealing steps can especially create overlay challenges. The result of these various fabrication steps is a substrate that is uneven or non-planar. For example, a backside of the substrate can have z-height differences (differences in vertical heights or distances perpendicular to a substrate surface) that have both high spots and low spots. Height differences due to such bowing can be on the order of about one micron to approximately 500 microns or more. This fluctuation is significant because semiconductor devices or structures being exposed by various exposure tools are being exposed on scales of tens of nanometers to hundreds of nanometers. Thus having deflection variations of thousands of nanometers to 10,000 nanometers can dramatically reduce yield as it is difficult to properly align two patterns.

Conventional techniques used to address substrate bow and uneven curvature on partially-processed substrates focus on chucking techniques to chuck (or clamp or suck) a substrate to a substrate holder to flatten curvature. With such significant bowing, however, it can be very difficult or impossible to accurately flatten a substrate by chucking a substrate alone. Thus, it is desirable to have a substrate overlay correction technique to improve and/or correct overlay prior to being sent or returned to a scanner/stepper for additional exposures.

Techniques herein include a system for correcting wafer overlay. Such a system can include several components. A metrology module is configured to measure bow of a substrate producing a bow measurement that maps z-height deviations on the substrate relative to one or more reference z-height values. A coating module is configured to coat a backside surface of a wafer with a radiation-sensitive material. A controller is configured to generate an overlay correction pattern that defines adjustments to internal stresses at specific locations on the substrate based on the bow measurement of the substrate, such that a first given location on the substrate has a different internal stress adjustment defined as compared to a second given location on the substrate in the overlay correction pattern. An imaging module is configured to expose the backside surface to a pattern of actinic radiation based on the overlay correction pattern. A development module is configured to develop the radiation-sensitive material after exposure to the pattern of actinic radiation to result in the radiation-sensitive material forming a relief pattern on the backside surface of the substrate. An etching module is configured to etch the backside surface of the substrate using the relief pattern as an etch mask thereby reducing overlay error of the substrate. In some embodiments, all of these modules are on a common platform in which an automated substrate handling system can automatically transport substrates among the modules. Accordingly, an all-in-one tool is created for fixing overlay errors. For example, wafers with overlay error can be loaded into this tool and then the system measures, calculates corrections, makes corrections, and then returns wafers having corrected or reduced overlay error.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include systems and methods for correcting pattern overlay errors by correcting or adjusting bowing of semiconductor substrates (wafers). Techniques herein include systems and methods for location-specific tuning of stress on wafers to reduce overlay error. Location-specific tuning of stress independently modifies specific regions, areas, or point locations on a substrate to change wafer bow at those specific locations. Such spatial stress tuning with differential control reduces overlay error on substrates, which in turn improves overlay of subsequent patterns created on the substrate. Techniques herein include receiving a substrate with some amount of overlay error, measuring bow of the substrate to map z-height deviations across the substrate, generating an overlay correction pattern, and then physically modifying internal stresses on the substrate at specific locations with these modifications and intensities being independent of other locations. Such modifications can include etching a backside surface of the substrate. One or more processing modules can be used for such processing. This location-selective etching results in a substrate with a modified bow having reduced overlay error.

Such techniques can include backside processing. Typically, wafers have a working surface and a backside surface. The working surface is the surface on which semiconductor devices are fabricated, such as transistors, diodes, gates, wiring, et cetera. The backside surface is typically opposite to the working surface and is the surface that is typically clamped or chucked to substrate holders. Techniques herein include adjusting stresses on the working surface of a substrate, but such working surface adjustments are often limited by stage of fabrication. Techniques herein also include backside surface processing to modify or tune internal stresses.

Figure 7:
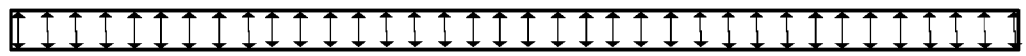
FIG. 7 is a side cross-sectional view illustrating a wafer.
Figure 8:
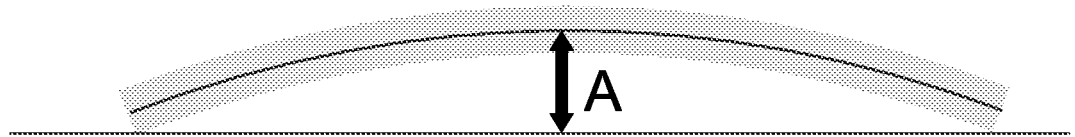
FIG. 8 is a side cross-sectional view illustrating wafer bowing.
Figure 9:
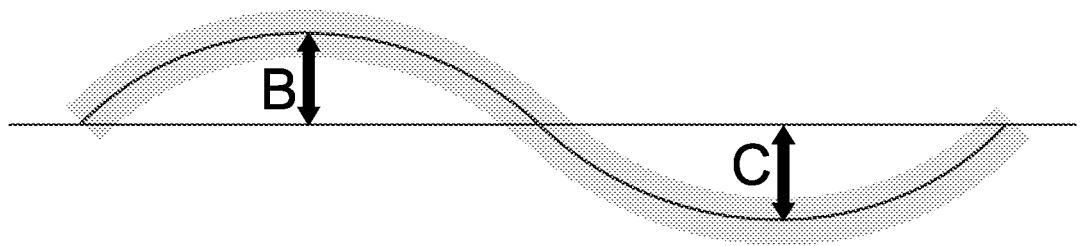
FIG. 9 is a side cross-sectional view illustrating wafer bowing.

Microfabrication of a semiconductor wafer begins with a flat wafer, such as that illustrated in FIG. 7. During microfabrication of a semiconductor wafer, multiple processing steps are executed that can include depositing material on a substrate, removing material, implanting dopants, annealing, baking, and so forth. The different materials and structural formations can cause internal stresses in the substrate which result in bowing of the wafer, which in turn affects overlay and typically results in overlay errors of various magnitude. FIG. 8 illustrates first order bowing with measurement A illustrating z-height deviation from a reference plane. FIG. 9 illustrates second order bowing of a substrate with measurements B and D identifying positive and negative z-height deviations. Since conventional processing to create circuits is one-sided (fabrication on the working surface) bowing can quickly develop. Stresses of equal and opposite magnitude can cancel each other out. According, one technique herein is to fabricate identical structures on the backside surface of the substrate as are being fabricated for the working surface (either functioning or dummy structures). Such dual-sided microfabrication, however, can be challenging because it is desirable to avoid placing the working surface on a substrate holder or chuck as this can destroy fragile structures prior to metallization or packaging. Thus, simply flipping a wafer over for fabrication of a mitigation pattern on the backside is not preferred.

Figure 10:
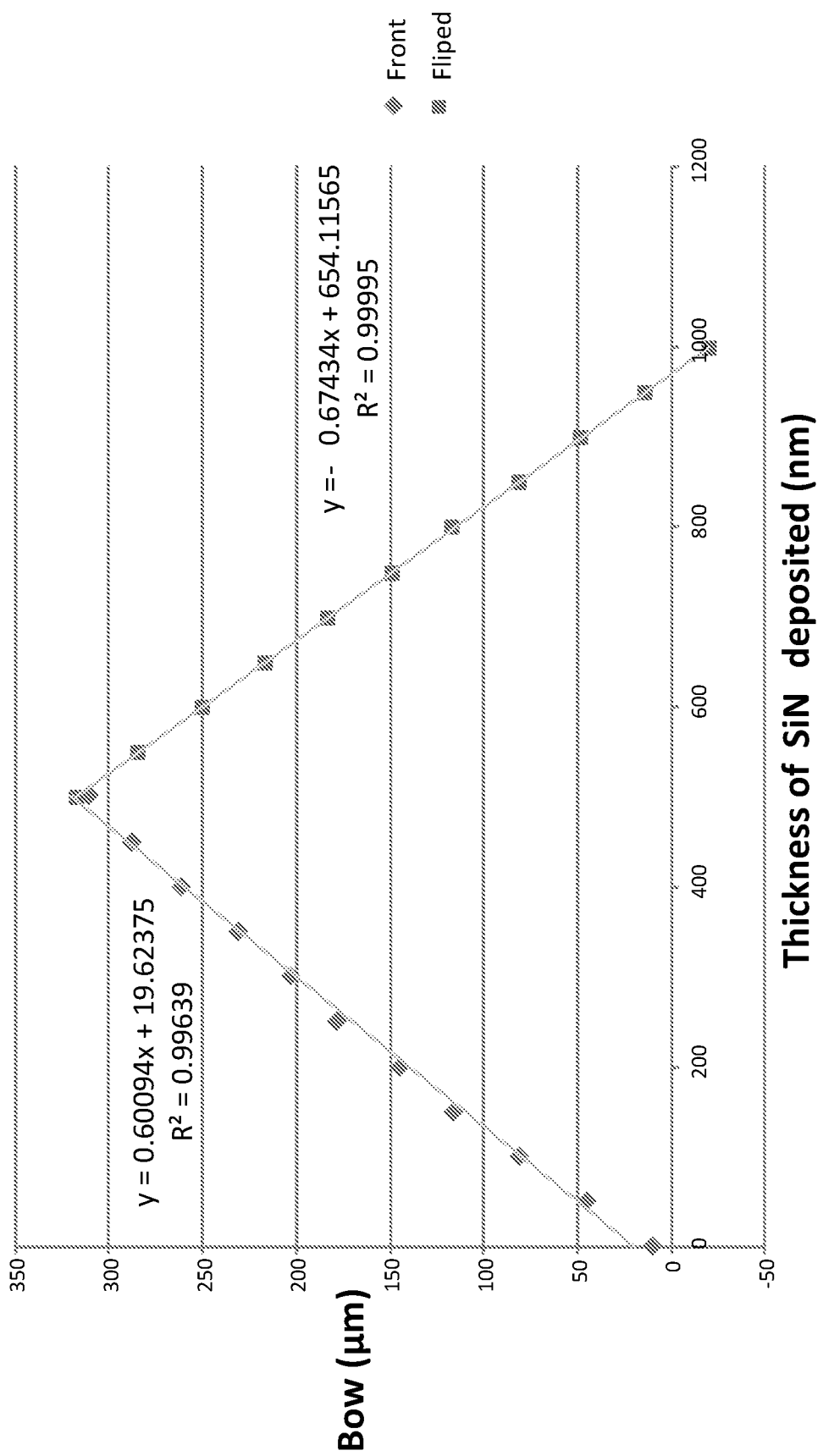
FIG. 10 is a graph depicting bow response from deposited material on a substrate.

Techniques herein, however, include backside processing techniques that add films, which can increase stresses, and then selectively relax locations on/in these films to tune internal stresses to adjust bow deviations. Added layers or films can selectively add tensile or compressive stress to a substrate. For example, FIG. 10 illustrates a graph of tensile silicon nitride being added to a substrate. As a thickness of deposited SiN increases, so does a positive bow (z-height deviation) on the substrate. As the thickness of the SiN is reduced, the positive bowing deviation is also reduce. A similar but mirrored result happens when depositing films with a compressive stress. As a thickness of a compressive film increases, a negative bow increases. Likewise, removing such a compressive film at locations reduces negative bowing at those locations.

Techniques of backside processing can include multiple steps. For example, a backside surface can be stripped or cleaned as a preliminary step. Then a metrology step can be executed that measures bow of a given wafer. This bow measurement can be used for targeted backside processing. The wafer can be coated with one or more materials. Such coating(s) can be set with a bake step if needed. Then the backside surface is exposed to a pattern of actinic radiation. The pattern of actinic radiation can be an overlay correction pattern based on the bow measurement or bow signature. For example, more or less radiation can be exposed to spatial locations on the wafer backside, such as by using a direct-write projection device. This can also be considered as exposing the coating to a corrected wafer bow image. The backside of the wafer is then developed and stripped to remove soluble portions after the patterned exposure. The resulting relief pattern can be used as an etch mask for etching one or more underlying layers, which relaxes internal stresses (compressive or tensile) which in turn modifies z-height deviations of the substrate. The result is a modified bow which reduces overlay errors.

One or more tools and/or modules can be used for techniques herein. For example, a single tool can include coater/developer modules, bake modules, metrology modules and imaging modules, all on a common platform. Alternative embodiments can use separate tools/systems, but may require manual wafer porting between tools. The benefit of a common platform is increased efficiency.

The wafer bow correction system herein receives an input of a substrate with some amount of overlay error and bow. The system measures the substrate to map bow deviations, generates an overlay correction or bow correction pattern, and then treats the backside to selectively relax/increase stresses by coordinate location on the substrate. The substrate is then returned with a comparatively reduced overlay error or reduced wafer bow. Treatment steps can include backside coating and bake, imaging, backside wet etch develop, and plasma stripping of one or more coatings. The platform based solution herein mechanically corrects bow. Techniques can be embodied as an offline tool used within a given fabrication flow to entirely back-out the bow signature. In other words, wafer data from previous fabrication techniques is not needed for input. Systems can be embodied with metrology equipment and processing equipment all on a common platform. Techniques herein can provide backside wet etch with 5 micron resolution being sufficient to correct overlay errors on the nanometer scale.

Figure 1:
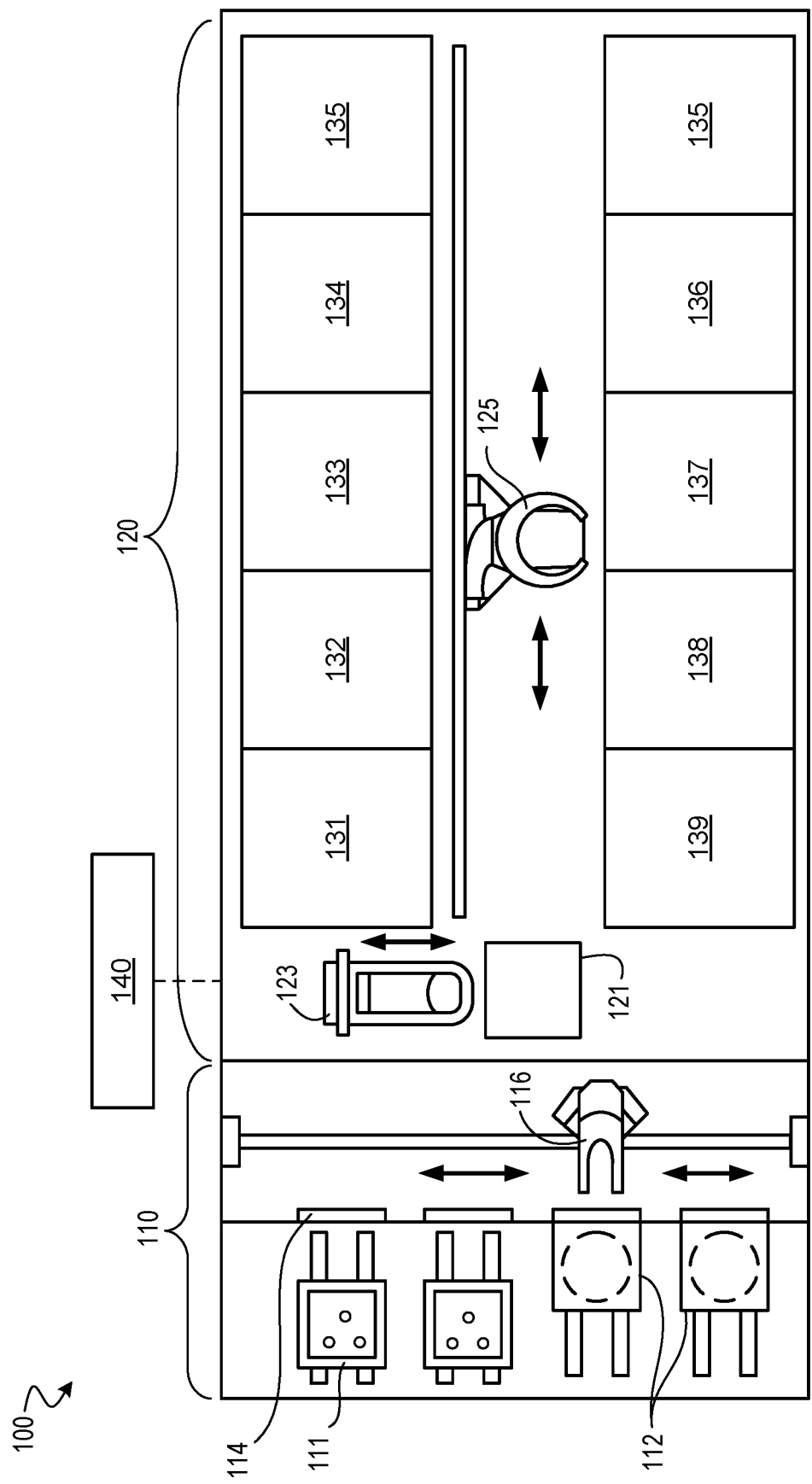
FIG. 1 is a plan view of an overlay correction system according to an embodiment herein.

FIG. 1 is a plan view of a system for correcting substrate overlay. In general, the system 100 includes various wafer handling components or carriers, along with several modules. Carrier block 110 includes stages 111 for receiving wafer carriers 112. Wafer carriers 112 can house several semiconductor wafers. Door 114 can open to access the several substrates in the wafer carriers. Transfer arm 116 can transfer substrates from wafer carriers 112 to shelf unit 121 in treatment block 120. Transfer arm 123 can be positioned adjacent to shelf unit 121 and capable of moving back and forth as well as vertically. Transfer arm 125 can then access substrates from shelf unit 121 or transfer arm 123 to move among the modules 131-139.

System 100 can include various different modules depending on a desired embodiment. Optionally there is a backside processing module, or a backside processing module and a metrology module. A separate system, however, and be used for metrology and can measure a given substrate and provide bow measurements to the system 100. In other embodiments a metrology module is included within system 100. For example, metrology module 131 can be configured to measure bow of a substrate and generate a bow measurement. Such a bow measurement maps z-height deviations on the substrate relative to one or more reference z-height values. In other words, z-height deviations are spatially mapped, such as with coordinate locations, to identify z-height deviations across a surface of the substrate. Z-height deviations can be mapped at various resolutions depending on type of metrology equipment used and/or a resolution desired. The bow measurement can include raw bow data, or be represented as a bow signature with relative values. Note that in many embodiments, the reference z-height values may be all close to zero and thus representative of a wafer that is close to being flat. For example, a wafer that is close to being flat or considered flat for overlay improvement herein can be a wafer having an average deviation of less than 10 microns. In other embodiments the reference z-height values can represent some non-planar shape, but which shape is, notwithstanding, useful for overlay error correction—especially for particular stages of micro fabrication. Techniques herein enable correction of bowing that is greater than 10 microns but less than 500 microns. The metrology module is configured to measure a substrate having a working surface and having a backside surface opposite to the working surface. The substrate has an initial overlay error resulting from one or more micro fabrication processing steps that have been executed to create at least part of a semiconductor device on the working surface of the substrate. For example, transistor gates may be completed or only partially completed.

Figure 3:
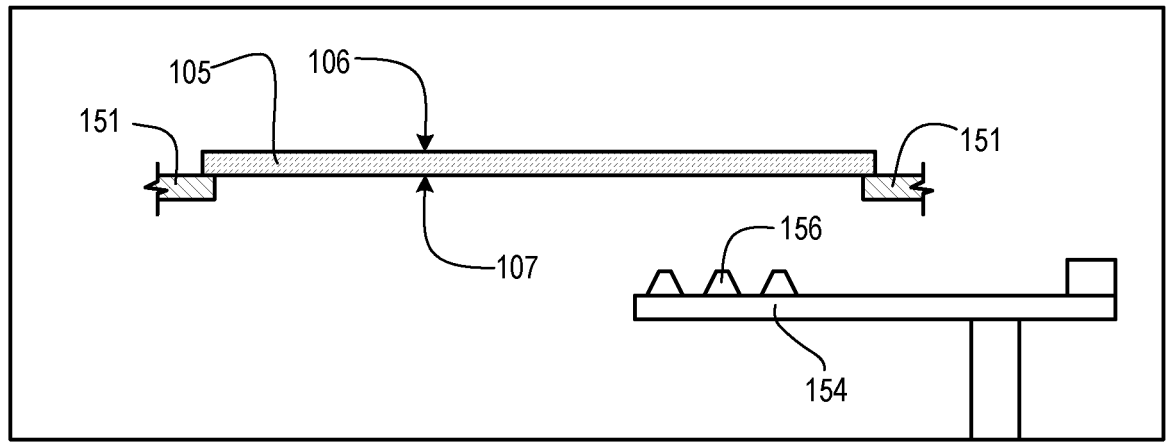
FIG. 3 is a side cross-sectional schematic view of a module for measurement and/or inspection.

FIG. 3 is a cross-sectional schematic view of a module for substrate measurement or inspection, such as for use as metrology module 131. A substrate 105 is held with perimeter support 151. Substrate 105 includes working surface 106 and backside surface 107. Note that either the working surface or the backside surface can be measured. In this illustration, the backside surface 107 is set for measurement. Measurement arm 154 can include sensors 156 to measure z-height deviations across the backside surface. There are several mechanisms available to measure z-height deviation including optical, acoustic, and others. The substrate 105 can be stationary while measurement arm 154 is moved. Alternatively, substrate 105 can be rotating. Measurement arm 154 can having sensors 156 in contact with backside surface 107 depending on a type of measurement mechanism selected.

Returning to FIG. 1, a controller 140 is connected to system 100. Controller 140 can be a computer processor located within system 100, or located remotely but in communication with components of the system 100. The controller 140 is configured to receive a bow measurement and generate an overlay correction pattern based on the bow measurement. The bow measurement can be received from the metrology module 131, or from a separate system. The overlay correction pattern defines adjustments to internal stresses at specific locations on the substrate based on the bow measurement. The overlay correction pattern can also be based on device parameters of the working surface of the substrate in addition to the bow measurement. For example, a relatively deep memory array can require more stress modification as compared to early stages of constructing a finFET device for logic. The overlay correction pattern can be generated or calculated using any of various calculation methods such as inter-plane deviation, z-height deviation from reference plane, multi-order derivative analysis for location of interest, analysis of Zernike polynomial, pixelated base functions optimization, or spherical Bessel functions.

In this overlay correction pattern, a first given location on the substrate has a different internal stress adjustment defined as compared to a second given location on the substrate in the overlay correction pattern. In other words, stress corrections to be made are specific to a location on the substrate surface. This location can be a point location, area, or region of the substrate. For example, the overlay correction pattern can define internal stress adjustments to make that result in a flat substrate (no bowing) or some selected bowing that is advantageous to subsequent patterning processes. Such internal stress adjustments can be based on type and thickness of films deposited on the backside surface of the substrate.

The system can include one or more processing modules having a substrate holder and substrate treatment components configured to physically modify internal stresses on the substrate at specific locations on the substrate according to the overlay correction pattern resulting in a modified bow of the substrate. The substrate with the modified bow has a second overlay error. The second overlay error has reduced overlay error as compared to the initial overlay error. The processing module can be configured to differentially modify internal stresses in that the processing module is configured to independently modify different locations on the substrate such that at least a portion of the different locations are modified differently as compared to each other. Although blanket or even/symmetrical internal stress corrections can be made, the processing module herein can be configured to modify stresses by coordinate location on the substrate.

The processing module can be configured to increase or relax internal stresses at locations on the substrate, and to modify internal stresses on either the working surface or the backside surface. The processing module can be configured to hold the substrate with the working surface facing upwardly (away from the earth's gravitational pull) while physically modifying internal stresses on the backside surface of the substrate. The metrology module and the processing module can be on a common platform having an automated substrate handling system that automatically moves the substrate from the metrology module to the processing module.

The processing module can be configured to modify internal stresses on the substrate by location-specific addition of material on the backside surface of the substrate in that a first given location on the substrate can have more material added as compared to a second given location. For example, a backside deposition system can use chemical vapor deposition while a pattern of light or heat is projected onto the backside surface. Because chemical vapor deposition can be dependent on surface temperature, more or less material can be deposited based on a light or heat pattern projected onto the backside surface. Accordingly, differential amounts of material are deposited by coordinate location. Upon completing of such a differential deposition process, the substrate has a modified bow that corrects or reduces overlay error.

In other embodiments, the processing module can be configured to modify internal stresses on the substrate by location-specific removal of material on the backside surface of the substrate in that a first given point location on the substrate can have more material removed as compared to a second given point location. This can include first adding one or more films to the backside surface of the substrate and then selectively removing material from the one or more films at given locations, such as by etching the backside surface using an etch mask. In other embodiments, the processing module can be configured to modify internal stresses on the substrate by location-specific implantation of particles into the backside surface of the substrate in that a first given location on the substrate can have more particles implanted as compared to a second given location. For example, an ion implantation tool can implant particles into the working surface or backside surface to either increase or reduce tensile/compressive forces thereby changing bow of the substrate. Such selective increase or reduction can depend on type of surface material being treated as well as type of particles being implanted. The processing module can be configured to modify internal stresses on the substrate by location-specific temperature modulation of a curing film. A given film being cured can develop stronger or weaker bonds based on a curing temperature. Temperature modulation can be achieved during curing by using a projection of heat or light in which individual projected pixels can be independently addressed or varied in intensity based on the overlay correction pattern.

Processing can be executed in one or more modules, depending on a type of treatment to the substrate to modify stresses. Accordingly, several modules can optionally be used. Although there are various mechanisms to modify stress (differential deposition, differential curing, ion implantation, selective etching), for convenience in describing embodiments, this disclosure will provide more example embodiments with respect to selective etching.

Figure 5:
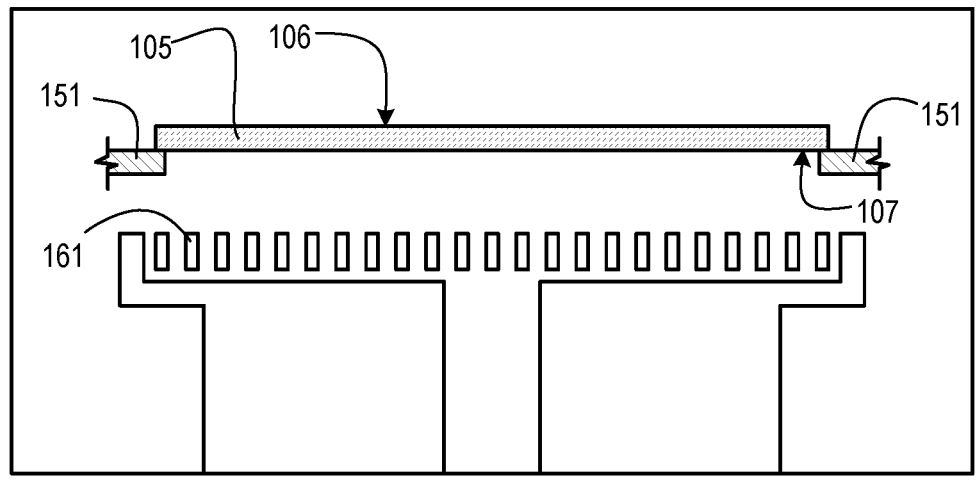
FIG. 5 is a side cross-sectional schematic view of a module for deposition according to embodiments disclosed herein.

System 100 can include deposition module 132, configured to deposit one or more films on the backside surface of the substrate. Deposition module 132 can be configured to deposit two or more films of opposing stresses. Alternatively, separate deposition modules are used for each film of opposing stress. Deposition module 132 can be configured to hold substrate 105 at a perimeter with backside surface facing upwardly, or downwardly. The backside surface can face upwardly for flowable or spin-on materials. Or deposition can be executed on the backside surface while held with the working surface facing upwards. For example, FIG. 5 is a cross-sectional schematic view of an example deposition module with gas distribution unit 161 used to flow deposition gas towards the backside surface. For embodiments with location-specific deposition, the projection system 167 of FIG. 6 can be added to the deposition module (for example, positioned on the side of the gas distribution unit) to project a pattern of differential deposition and thus differential stresses.

Figure 4:
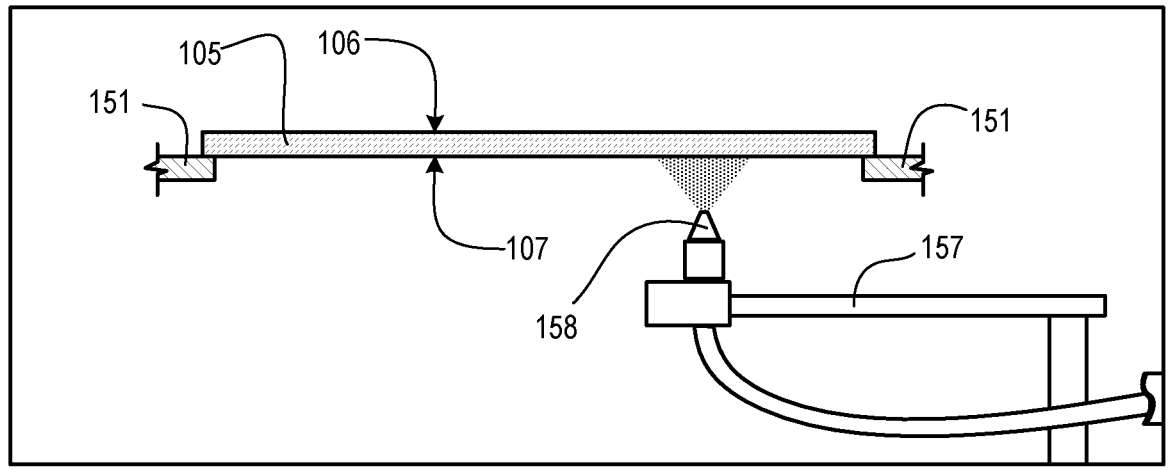
FIG. 4 is a side cross-sectional schematic view of a module for coating, developing, and/or cleaning.

System 100 can include coating module 133. Coating module 133 is configured to coat a backside surface of the substrate with a radiation-sensitive material, such a photoresist. FIG. 4 is a cross-sectional schematic illustration of an example coating module. Positioning arm 157 can move nozzle 158 to various areas underneath a stationary or spinning substrate. Rotation can be effected by perimeter rotators. In some embodiments, resist can be sprayed onto the backside surface. In other embodiments, nozzle 158 can almost be in contact with the backside surface as a viscous resist is spread, brushed, or otherwise pushed onto the substrate.

A bake module 134 can be included in system 100 and configured to bake the radiation-sensitive material on the backside surface of the substrate. Bake module 134 can be used at various processing steps as with conventional patterning, such as pre-exposure bake, post-exposure bake, and post-development bake. Bake modules are conventionally known A controller 140 is configured to generate an overlay correction pattern that defines adjustments to internal stresses at specific locations on the substrate based on the bow measurement of the substrate. In such overlay correction pattern (or bow correction pattern) a first given location on the substrate has a different internal stress adjustment defined as compared to a second given location on the substrate in the overlay correction pattern. Such a correction pattern can be calculated to reduce first order bowing, second order bowing, or higher. The overlay correction pattern can be represented as a pattern of actinic radiation to be projected into photoresist.

The overlay correction pattern or image can be defined with sufficient additional supports to be created in areas of resist that would otherwise be removed. For example, rows of lines or an array of mesas can be patterned to provide mechanical support structures after development for transfer into an underlying pattern sufficient to be in contact with pins on a photolithography chuck when positioned on the photolithography chuck. Conventional photolithography chucks have an array of pins on which a substrate rests, instead of this chuck having a perfectly flat surface. Chuck pin diameters can be 100-150 microns in diameter. It can be the case in some overlay correction patterns that relatively large regions of material are to be removed from the backside surface of the substrate. With this material removed, there will be gaps or missing material to be in contact with chuck support pins. Accordingly, the overlay correction pattern can essentially add sufficient supports (such as lines or pillars) in particular areas to make sure that after etching the backside surface and cleaning the photoresist, there are still sufficient supports on the backside surface to be in contact with the photolithography chuck when clamping the substrate.

Figure 6:
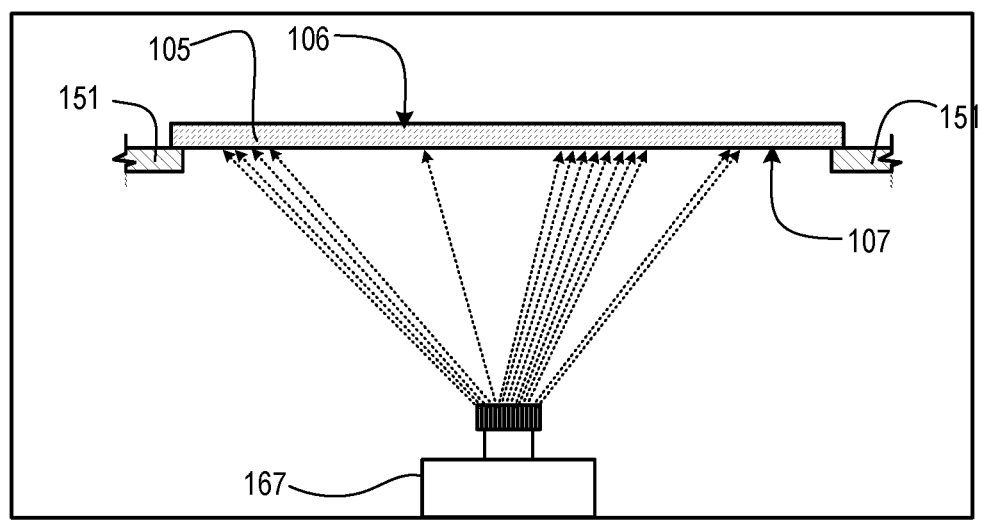
FIG. 6 is a side cross-sectional schematic view of an exposure module according to embodiments disclosed herein.

System 100 includes imaging module 135, which is configured to expose the backside surface to a pattern of actinic radiation based on the overlay correction pattern. In some embodiments, a photo-mask based projection system can be used, but in other embodiments a direct-write system can be used. One benefit with direct-write exposure systems is that the pattern of actinic radiation can change with each substrate processed based on each substrate bow measurement. FIG. 6 is a cross-sectional schematic illustration of a projection system 167 exposing the backside surface of the substrate to a pattern of actinic radiation based on the overlay correction pattern. The substrate can be held with the working surface facing upwardly, while the projection system 167 exposes the backside surface from underneath. The image projection system can, for example, use a micromirror projection device that projects a pixel-based image onto the backside surface of the substrate according to the overlay correction pattern. One or more micro mirrors can be used to direct light onto the substrate. Example micromirror projection devices include Digital Light Projection (DLP) chips, laser galvanometers, and grating light valves. The image can be projected all at once, or scanned across line-by-line. Any other technology can be used that is capable of steering a laser beam or other light source onto a layer of photoresist according to an overlay correction pattern. For overlay correction herein to change a wafer bow, various light sources can be used and various spectral lines can be used including 436 nanometers, 405 nanometers, 365 nanometers, 248 nanometers, and 193 nanometers. Note that for overlay correction herein, patterning and relaxing/increasing stresses on the scale of a few microns can result in nanometer adjustments/improvements in overlay. Accordingly, conventional photolithography tools are not required and instead exposure can be effective herein using relatively lower resolutions as compared to two-digit nanometer resolution of some scanner systems.

The overlay correction pattern can be generated or adjusted based on projection from a single light exposure. For example, in areas (or regions or point locations) that need no material removal, the photoresist can remain, for areas that need maximum internal stress relaxing these area can be fully cleared of photoresist. For areas that need stress tuning between zero and maximum, this area can be converted into smaller or larger openings, variable arrays of mesas or lines, et cetera. Similar to black ink used to make grayscale in news print, more or less openings in the photoresist can be created at specific locations to differentially tune stresses. Note that this process can be inverted depending on tone of photoresist being used as well as tone of developer being used. An amount of actinic exposure can also be based on thickness of a given film added for stress relaxing/increasing.

Figure 2:
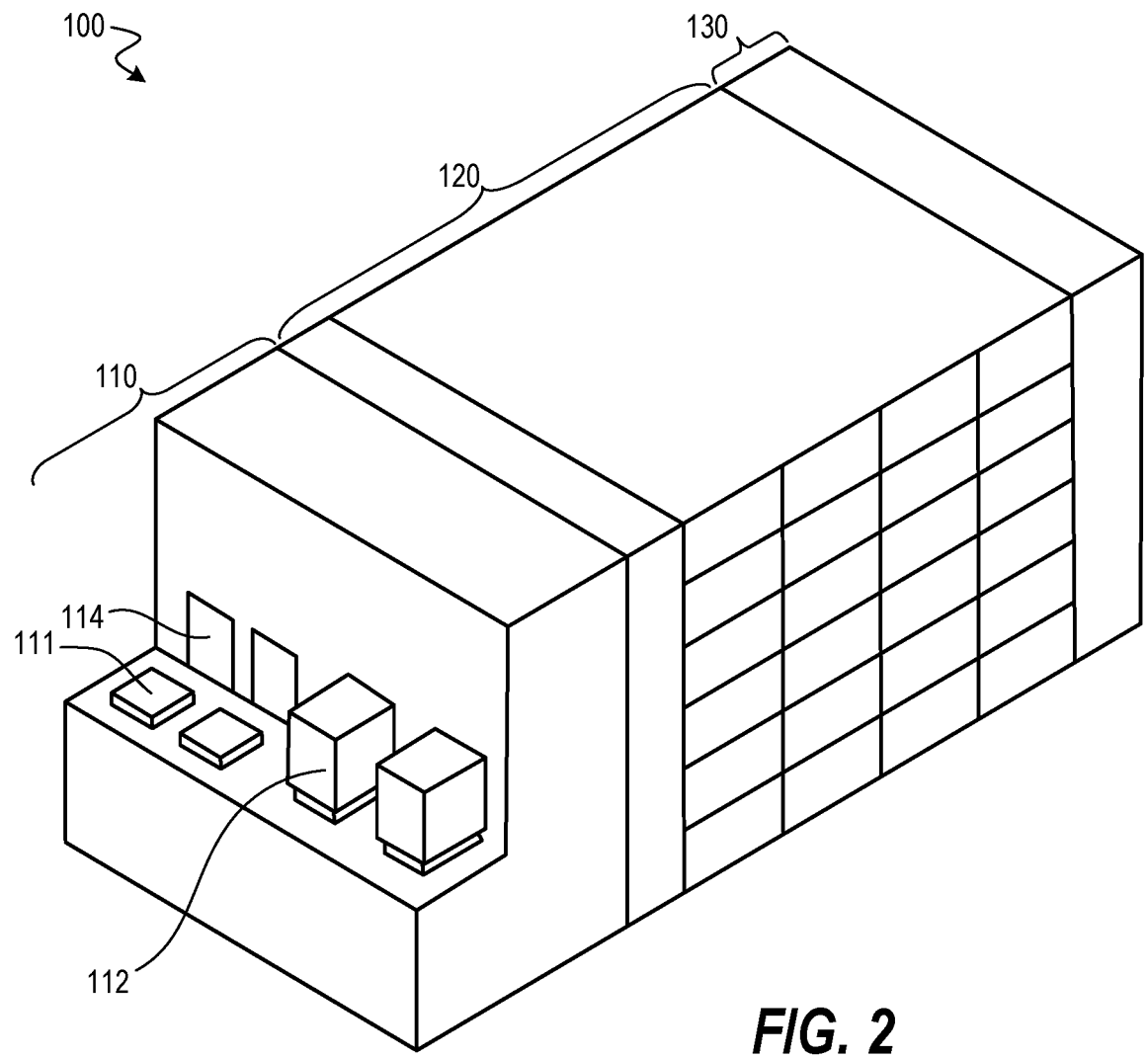
FIG. 2 is a perspective view of an overlay correction system according to an embodiment herein.

The imaging module can be included within treatment block 120 among other processing modules, or can be in a separate block such as treatment block 130 illustrated in FIG. 2. For example, the various modules herein can be constructed to be included as one or more modules of a track system. Track systems are routinely designed to connect a scanner or stepper tool. Instead, a direct-write exposure tool can be connected to such a track system reconfigured for overlay correction.

The system 100 can include development module 136. FIG. 4 can also illustrate a development configuration in which a solvent developer is sprayed or otherwise applied to the exposed photoresist to develop the latent image in the photoresist. After soluble portions are removed from the layer of photoresist, the result is a relief pattern defining areas to be etched.

The system 100 includes etching module 137. The etching module 137 can be configured to use plasma or vapor-phase etching or wet etching. For substrate bow (z-height) corrections herein, wet etching is sufficient to provide effective results, and is also a cost-effective solution. Beneficial results can be achieved with pattern openings around a lower resolution of single digit microns. At such scales, wet etching is sufficient because any undercutting of the etch mask is within tolerance. Accordingly, the etching module 137 is configured to use the relief pattern as an etch mask thereby reducing overlay error of the substrate.

The system 100 can also include a cleaning module 138, which can include a stripping module. Alternatively a separate stripping module is used. Such a stripping module can be configured to remove remaining radiation-sensitive material from the backside surface after an etching operation. The stripping module can remove the photoresist using liquid chemistry or can ash or burn off the remaining photoresist such as by using plasma. Such a plasma stripping module can be a point location plasma that is moved across a spinning substrate. FIG. 4 illustrates an example configuration of a stripping module or cleaning module. Like other modules a stripping or cleaning module can be configured to clean/strip a backside surface of the substrate while the substrate is held with the working surface facing upwardly. An inspection module 139 can optionally be used to inspect for defects after overlay correction processing.

An automated substrate handling system is configured to transport substrates among the various modules including the metrology module, the deposition module, the coating module, the baking module, the imaging module, the development module and the etching module. Two or more of the various modules can all be on the same or common platform. The automated substrate handling system can be configured to rotate or flip the substrate as needed by the various modules, though a given substrate can have a backside processing performed throughout this overlay correction process while the working surface of the substrate remains facing upwardly. For embodiments that flip a substrate so that the working surface is facing downwardly and held by a conventional substrate holder or chuck, techniques can include adding a protection film to the working surface to protect the working surface (and devices thereon).

Figure 11:
FIG. 11 is cross-sectional schematic view of an example substrate segment showing a process flow according to embodiments disclosed herein.
Figure 12:
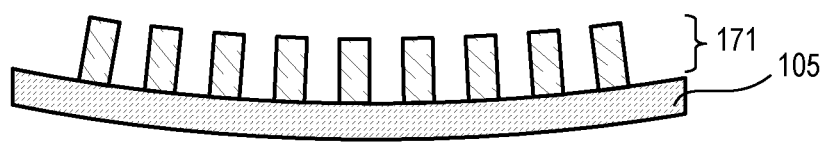
FIG. 12 is cross-sectional schematic view of an example substrate segment showing a process flow according to embodiments disclosed herein.

Techniques herein also include methods for correcting wafer overlay, which can be executed on one or more systems. In one embodiment, a substrate is received having a working surface and having a backside surface opposite to the working surface. The substrate has an initial overlay error resulting from one or more micro fabrication processing steps that have been executed to create at least part of a semiconductor device on the working surface of the substrate. FIG. 11 is a side cross-sectional view of an example substrate segment prior to processing. FIG. 12 illustrates devices 171 having been formed thereon. Note that forming devices 171 causes negative bowing, though z-height deviations can vary depending on type of structures created on the working surface of the substrate.

Figure 15:
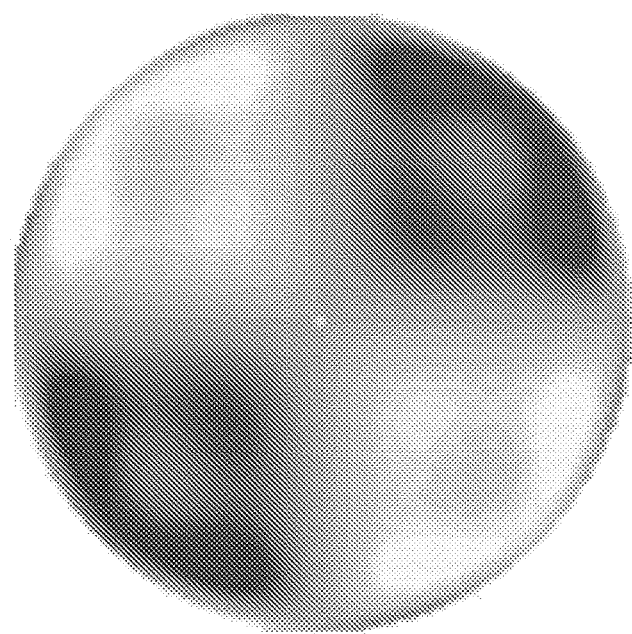
FIG. 15 is a representation of wafer bow measurement with overlay error according to embodiments disclosed herein.

An initial bow measurement of the substrate is received that maps z-height deviations on the substrate relative to one or more reference z-height values. This initial bow measurement can be received from a bow measurement tool, or derived from curvature measurements of the substrate, or other measurement techniques. FIG. 15 is a graphical measurement of bow on a given wafer having overlay error. For convenience in understanding, bow measurement representations show simplified images.

Figure 16:
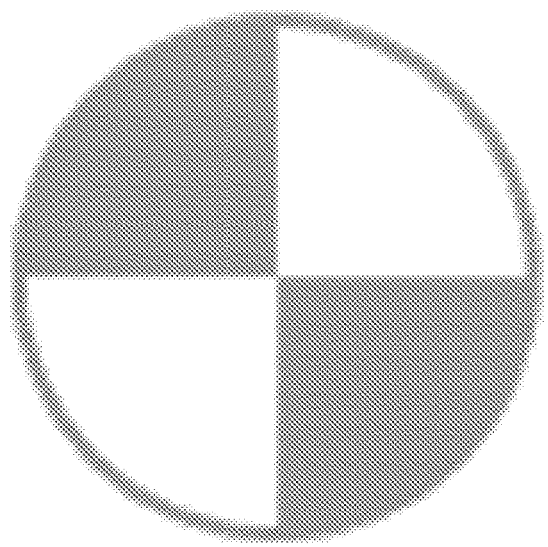
FIG. 16 is a representation of an overlay correction pattern according to embodiments disclosed herein.

An overlay correction pattern is generated that defines adjustments to internal stresses at specific locations on the substrate based on the initial bow measurement of the substrate. In the overlay correction pattern, a first given location on the substrate has a different internal stress adjustment defined as compared to a second given location on the substrate in the overlay correction pattern. FIG. 16 is a graphical representation of an overlay correction pattern for bow modification and overlay error reduction. The overlay correction pattern can then define location-specific adjustments to internal stresses on the substrate of a plurality of locations on the substrate calculated to reduce overlay error.

The overlay correction pattern can be based on device parameters on the working surface of the substrate. For example, knowing a type of device (finFET, NAND, capacitor columns, et cetera, being fabricated—with their associated material types, spatial densities, and aspect ratios—can influence an amount of internal stress to tune and or bow deflection to address.

Figure 17:
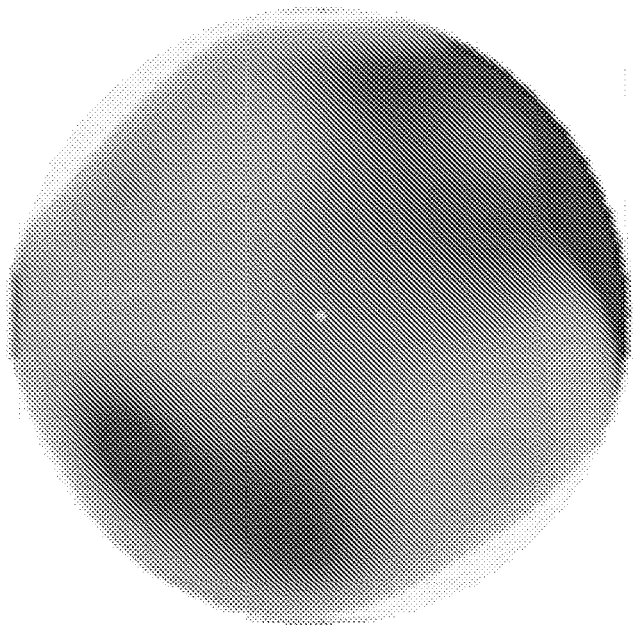
FIG. 17 is a representation of a wafer bow measurement with reduced overlay error according to embodiments disclosed herein.

Internal stresses of the substrate are then physically modified at specific locations on the substrate according to the overlay correction pattern resulting in a modified bow of the substrate. The substrate with the modified bow has a second overlay error. The second overlay error has reduced overlay error as compared to the initial overlay error. FIG. 17 illustrates a second or subsequent bow measurement showing reduced bowing and having reduced overlay error. While the modified bow can be a substrate that is planar, the modified bow can also characterize a non-planar substrate yet with improved overlay accuracy. Physically modifying internal stresses can include differentially modifying internal stresses such that different locations on the substrate are independently modified, and at least a portion of the different locations are modified differently as compared to each other. Thus, stresses can be independently and spatially modified.

Such modification can include increasing or relaxing internal stresses on the working surface or on the backside surface of the substrate. The action of physically modifying internal stresses on the substrate can occur multiple times during fabrication of an integrated circuit on the working surface of the substrate. For example, as substrates become bowed to a point at which overlay error is outside of tolerance, the affected substrate can be ported to system 100 and then overlay correction techniques herein can be executed. Thus, all of the processes of measuring the substrate and modifying internal stresses can be executed on a common platform using one or more modules. Such internal stress tuning can include using one or more treatment processes. Example processing includes location-specific particle implantation, location-specific etching, location-specific cross-linking, location-specific temperature differential curing, location-specific differential deposition, and so forth. For example, a particular plastic material can be deposited, coated, or otherwise applied to the backside surface. This plastic film (or carbon film, monomer film, et cetera) can initially have no significant internal stress. Using a direct-write exposure tool or other localized area-specific heating mechanism, the plastic film can be cross-linked at specific locations (regions) where an exposure tool has caused cross-linking to occur. This localized heating or exposure creates internal stresses at those specific locations, which stresses in turn cause bow modification to thereby correct wafer overlay. In this embodiment, the plastic film can be left on the backside surface during subsequent micro fabrication steps. This embodiment can also provide overlay correction without a developing and etching step.

The overlay correction pattern can be generated using any number of calculation methods for z-height or curvature correction. Example calculation methods include inter-plane deviation, z-height deviation from reference plane, multi-order derivative analysis for location of interest, analysis of Zernike polynomial, pixelated base functions optimization, spherical Bessel functions, and so forth. Locations of interest can further be derived from experiment or experimental calibration. Bow and curvature are related. For such substrate bow correction, example curvature calculations are shown below.

Displacement Field:

$$w = \sum_{n,m} a_n^m Z_n^m\left(\frac{r}{R}, \theta\right)$$

$$= \sum_{n,m} a_n^m R_n^m\left(\frac{r}{R}\right) \begin{cases} -\sin m\theta & m < 0 \\ \cos m\theta & m \geq 0 \end{cases}$$

Curvature Fields:

$$\kappa_{rr} = \frac{\partial^2 w}{\partial r^2}$$

$$\kappa_{\theta\theta} = \frac{1}{r}\frac{\partial w}{\partial r} + \frac{1}{r^2}\frac{\partial^2 w}{\partial \theta^2}$$

$$\kappa_{r\theta} = -\frac{1}{r^2}\frac{\partial w}{\partial \theta} + \frac{1}{r}\frac{\partial^2 w}{\partial r \partial \theta}$$

Mean Curvature:

$$\frac{\kappa_{rr} + \kappa_{\theta\theta}}{2} = \nabla^2 w$$

$$= \frac{\partial^2 w}{\partial r^2} + \frac{1}{r}\frac{\partial w}{\partial r} + \frac{1}{r^2}\frac{\partial^2 w}{\partial \theta^2}$$

$$= \sum_{m,n} a_n^m \left[ R_n^{m\prime\prime}\left(\frac{r}{R}\right) + \frac{R_n^{m\prime}\left(\frac{r}{R}\right)}{r} - \frac{m^2 R_n^m\left(\frac{r}{R}\right)}{r^2} \right] \begin{cases} -\sin m\theta & m < 0 \\ \cos m\theta & m \geq 0 \end{cases}$$

Gaussian Curvature:

$$K = \kappa_{rr}\kappa_{\theta\theta}$$

As shown in FIG. 10, a degree of bowing increases and decreases linearly with amount of stressed material added to a substrate surface. Accordingly, thickness of material to be removed can be based on bow measurements with straightforward calculations. With a magnitude of bow measurements, or mean values, a particular thickness of films can be determined for depositing on the backside surface. Then material is removed from specific locations to result in opposite or compensating stresses/forces to modify/correct the substrate bow for improved overlay.

In another embodiment, a method is used to correct wafer overlay. A substrate is received having a working surface and a backside surface opposite to the working surface. The substrate has an initial overlay error resulting from one or more micro fabrication processing steps that have been executed to create at least part of a semiconductor device on the working surface of the substrate. FIG. 12 illustrates an example substrate segment having bowing as a result of devices 171 on the working surface. Bow of the substrate is measured to produce a bow measurement that maps z-height deviations on the substrate relative to one or more reference z-height values.

An overlay correction pattern is generated that defines adjustments to internal stresses at specific locations on the substrate based on the bow measurement of the substrate. In the overlay correction pattern, a first given location on the substrate has a different internal stress adjustment defined as compared to a second given location on the substrate in the overlay correction pattern.

Figure 13:
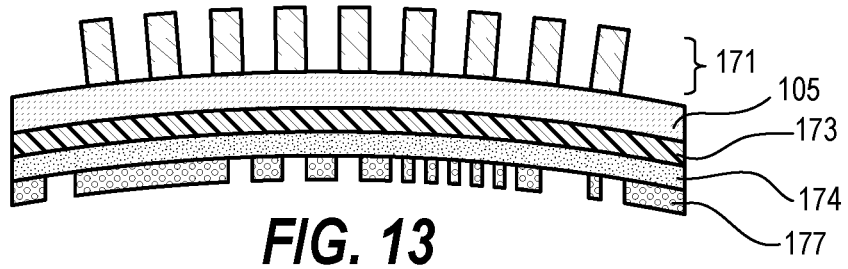
FIG. 13 is cross-sectional schematic view of an example substrate segment showing a process flow according to embodiments disclosed herein.

One or more films are deposited on the backside surface of the substrate. For example, a first film 173 can be deposited on the backside surface. First film 173 can be selected as an etch stop layer, which is resistant to one or more wet etch chemistries, such as a particular silicon nitride. This first film can also assist with counter stresses. This film can be compressive or tensile, depending on what material is deposited, or what type of nitride is deposited. Second film 174 can be a stress tuning film. An example film can be silicon oxide. These two or more films can assist with counter stresses. These two films can have opposing stresses. For example, the first film deposited can have a compressive internal stress, while the second film has a tensile internal stress. These stresses can be reversed, or be a same type of stress (both tensile stress). Note that in FIG. 13, bow of substrate 105 is reversed in that there is a positive bow (above centerline) instead of a negative bow. With the counter stress from the deposited films, this internal stress can be selectively relaxed or modified at various locations when etched, following the overlay correction pattern. In other embodiments, a single film, such as silicon nitride is deposited, and then an etch masked is formed thereon With one or more films on the backside surface of the substrate, the backside surface can be coated with a layer of photoresist. Conventional bake processes can then set the photoresist. The layer of photoresist can then be imaged using a pattern of actinic radiation based on the overlay correction pattern. Such imaging can be executed using a direct-write projection device. Such a device can project a pixel-based image using micro mirror projection or micro grating projection or another mechanism for steering a beam or projection of light. For example, such micro-mirror projection can include micro-mirror arrays and laser galvanometer, to name a couple.

Figure 14:
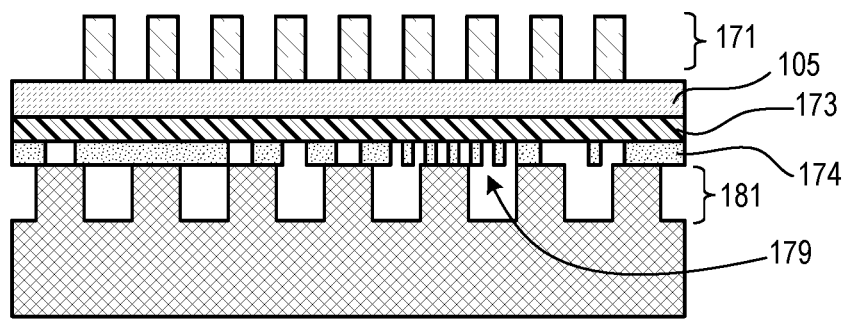
FIG. 14 is cross-sectional schematic view of an example substrate segment showing a process flow according to embodiments disclosed herein.

The layer of photoresist can then be developed to remove soluble portions of the layer of photoresist resulting in a relief pattern 177 of photoresist that uncovers portions of the backside surface, such as second film 174. Uncovered portions of the backside surface can then be etched using the relief pattern as an etch mask. Such etching can be executed with the backside surface facing downwardly. This etching results in a modified bow of the substrate. The substrate with the modified bow has a second overlay error. The second overlay error has a reduced overlay error as compared to the initial overlay error. A result is shown in FIG. 14. Note that second film 174 has material that has been etched away. Relief pattern 177 has been removed. Note that at area 179, several small structures are remaining. This particular region can be initially defined to have full material removal, but support structures are created or left so as to be in contact with chuck pins 181. Accordingly, an overlay correction pattern can be modified to be based on substrate supports of a separate lithography tool.

After the relief pattern 177 is used as an etch mask, the relief pattern 177 can be stripped, or ashed or burned off, such as with an atmospheric plasma source in contact with the layer of photoresist. All of the processing steps herein can optionally be executed on a common platform, such as a track tool, that can move substrates among various modules. More or less of particular modules can be used depending on processing times. For example, baking typically takes longer than exposures, and so more baking modules can be used compared to imaging modules.

In some embodiments, first order bow can be corrected with a blanket counter stress film. Second order bow can be corrected with a complex or differential counter image or overlay correction pattern transferred in a blanket stress film.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A system for correcting wafer overlay on a substrate, having a front side working surface and a backside working surface, and having an initial overlay error after a series of processing steps on the front side working surface, the system comprising:
a coating module configured to coat the backside surface of a substrate with a radiation-sensitive material;
a controller configured to generate an overlay correction pattern that defines adjustments to internal stresses at specific locations on the substrate based on an overlay measurement of the substrate, wherein a first given location on the substrate has a different internal stress adjustment defined as compared to a second given location on the substrate in the overlay correction pattern;
an imaging module configured to expose the backside surface to a pattern of actinic radiation based on an overlay correction pattern; and
a development module configured to develop the radiation-sensitive material after exposure to the pattern of actinic radiation to result in the radiation-sensitive material forming a relief pattern on the backside surface of the substrate that, when etched before a next processing step on the front side working surface occurs, results in a modified overlay error, the modified overlay error having a reduced overlay error as compared to the initial overlay error.

2. The system of claim 1, further comprising an automated substrate handling system configured to transport the substrate among, the coating module, the imaging module, and the development module.

3. The system of claim 2, wherein all of the coating module, the imaging module, and the development module are on a common platform.

4. The system of claim 2, wherein the automated substrate handling system is configured to rotate the substrate to selectively have a working surface or a backside surface facing upwards.

5. The system of claim 1, further comprising a stripping module configured to remove remaining radiation-sensitive material from the backside surface.

6. The system of claim 5, wherein the stripping module is configured to use plasma to burn off the remaining radiation-sensitive material from the backside surface.

7. The system of claim 5, wherein the stripping module is configured to use liquid chemistry to remove the remaining radiation-sensitive material from the backside surface.

8. The system of claim 1, further comprising a bake module configured to bake the radiation-sensitive material on the backside surface of the substrate.

9. The system of claim 1, further comprising a deposition module configured to deposit one or more films on the backside surface of the substrate.

10. The system of claim 9, wherein the deposition module is configured to deposit two or more films of opposing stresses.

11. The system of claim 1, wherein the system is configured to generate the pattern of actinic radiation as a bow correction image.

12. The system of claim 11, wherein the system is configured to generate the overlay correction image sufficient to reduce at least second order bowing.

13. The system of claim 1, wherein the imaging module is configured to use a direct-write exposure tool.

14. A method for correcting wafer overlay, the method comprising:
receiving a substrate having a working surface and a backside surface opposite to the working surface, the substrate having an initial overlay error resulting from one or more micro fabrication processing steps that have been executed to create at least part of a semiconductor device on the working surface of the substrate;
generating an overlay correction pattern that defines adjustments to internal stresses at specific locations on the substrate based on an overlay measurement of the substrate, wherein a first given location on the substrate has a different internal stress adjustment defined as compared to a second given location on the substrate in the overlay correction pattern;
coating the backside surface of the substrate with a layer of photoresist;
imaging the layer of photoresist on the backside surface of the substrate using a pattern of actinic radiation based on the overlay correction pattern; and
developing the layer of photoresist before a next processing step on the front side working surface occurs to remove soluble portions of the layer of photoresist resulting in a relief pattern of photoresist that uncovers portions of the backside surface to result in a modified overlay error, the modified overlay error having a reduced overlay error as compared to the initial overlay error.

15. The method of claim 14, wherein the backside surface of the substrate includes one or more deposited films having an internal stress that is modifiable when etched.

16. The method of claim 14, further comprising depositing one or more films on the backside surface of the substrate prior to coating the backside surface with the layer of photoresist.

17. The method of claim 16, wherein depositing the one or more films on the backside surface includes depositing a first film and depositing a second film, wherein the first film and the second film have opposing stresses.

18. The method of claim 17, wherein the first film is deposited prior to depositing the second film.

19. The method of claim 16, wherein depositing the one or more films on the backside surface includes depositing a first film and depositing a second film, wherein the first film has a compressive internal stress, and wherein the second film has a tensile internal stress.

20. The method of claim 14, wherein the pattern of actinic radiation is projected using a direct-write projection device.

* * * * *